(12) United States Patent
Hashimoto et al.

(10) Patent No.: US 6,225,569 B1
(45) Date of Patent: May 1, 2001

(54) WIRING SUBSTRATE AND METHOD OF MANUFACTURING THE SAME

(75) Inventors: Hiroyuki Hashimoto, Kasugai; Kazuhisa Sato, Kounan, both of (JP)

(73) Assignee: NGK Spark Plug Co., Ltd., Aichi-ken (JP)

( * ) Notice: Subject to any disclaimer, the term of this patent is extended or adjusted under 35 U.S.C. 154(b) by 0 days.

(21) Appl. No.: 08/970,501

(22) Filed: Nov. 14, 1997

(30) Foreign Application Priority Data

Nov. 15, 1996 (JP) .................................................... 8-320993

(51) Int. Cl.[7] ...................................................... H05K 1/16
(52) U.S. Cl. ........................... 174/260; 174/255; 174/261; 257/766; 257/781; 228/180.22
(58) Field of Search ..................... 174/250, 255, 174/260, 261; 228/180.21, 180.22; 257/736, 737, 738, 739, 741, 748, 750, 751, 753, 766, 780, 781

(56) References Cited

U.S. PATENT DOCUMENTS

| | | | |
|---|---|---|---|
| 3,781,596 | * 12/1973 | Galli et al. | 361/751 |
| 5,134,461 | 7/1992 | Yamakawa et al. | 257/766 |
| 5,175,609 | * 12/1992 | DiGiacomo et al. | 257/766 |
| 5,190,601 | 3/1993 | Yamakawa et al. | 148/518 |
| 5,635,764 | * 6/1997 | Fujikawa et al. | 257/766 |
| 5,838,069 | 11/1998 | Itai et al. | 257/438 |

FOREIGN PATENT DOCUMENTS

| | | |
|---|---|---|
| 52-054897 | 5/1977 | (JP) . |
| 52-117066 | 10/1977 | (JP) . |
| 57-032662 | 2/1982 | (JP) . |
| 59-114846 | 7/1984 | (JP) . |
| 60-142547 | 7/1985 | (JP) . |
| 61-195991 | 8/1986 | (JP) . |
| 2-240995 | 9/1990 | (JP) . |
| 5-106082 | 4/1993 | (JP) . |
| 8-306816 | * 11/1996 | (JP) . |

* cited by examiner

*Primary Examiner*—Albert W. Paladini
(74) *Attorney, Agent, or Firm*—Finnegan, Henderson, Farabow, Garrett & Dunner, L.L.P.

(57) ABSTRACT

A wiring substrate to which an IC chip is connected through soldering is formed from ceramic having electrode pads formed of a metallization layer. At least one nickel layer is formed on the electrode pads. The nickel layer has a thickness in the range of 2.5 $\mu$m to 8 $\mu$m. The nickel layer is preferably composed of a plurality of plated layers, and the outermost layer thereof is preferably formed through Ni-B plating. A gold plating layer is preferably formed on the outermost nickel layer. Further, heating is advantageously performed at least one time during the formation of the plurality of nickel layers.

14 Claims, 7 Drawing Sheets

WIRING SUBSTRATE AND METHOD OF MANUFACTURING THE SAME

BACKGROUND OF THE INVENTION

1. Field of the Invention

The present invention relates to a wiring substrate, and particularly to a wiring substrate having a plurality of electrode pads to which electrical components such as semiconductor integrated circuit chips are connected through soldering.

2. Description of the Related Art

A method for bonding semiconductor integrated circuit chips (so called flip-chip bonding) involves connecting a semiconductor integrated circuit chip (hereinafter referred to as an "IC chip" or simply as a "chip") to a wiring substrate by directly bonding electrode pads (input/output terminals) arranged on the entire surface of one main face of the IC chip to corresponding electrode pads on the wiring substrate through face-down soldering. Flip-chip bonding is widely employed in wiring substrates of the ball grid array (BGA), pin grid array (PGA), and land grid array (LGA) types, because it facilitates bonding of chips in high densities.

In a ceramic wiring substrate formed from, for example, alumina ceramic, electrode pads (hereinafter referred to as pads) are formed thereon in the following manner. Through use of metallization paste comprising mainly high-melting-point metal powders, such as tungsten and molybdenum powders, patterns (circles, rectangles, and the like) of electrode pads are printed in a predetermined array on a laminated alumina green sheet, followed by co-firing. Thus, metal layers, serving as pads for connection to elements and a printed circuit board (a mother board), are formed on the surface of the ceramic substrate. Thereafter, the metal layers are plated with nickel-boron (Ni-B) by, for example, electroless plating. The thus-plated metal layers are further plated with gold (Au) to prevent oxidation.

As shown in FIGS. 7 and 8, in such a flip-chip bonding type assembly, an IC chip 31 is placed on a wiring substrate 1 such that electrode pads 32 of the IC chip 31 are aligned with corresponding electrode pads 11 of the wiring substrate 1. Thereafter, solder bumps 33 having a relatively high melting point and having been formed previously on the pads 32 or 11 are caused to reflow through application of heat, to thereby establish the electrical connection between the pads 11 and 32.

Recently, however, it has been pointed out that pores or voids V are frequently formed, for unknown cause, in solder bumps formed on the pads 11 of the wiring substrate 1, or, as shown in FIG. 8, in the solder 33 connecting the pads 11 and 32 in a semiconductor device wherein the IC chip 31 is flip-chip bonded to the wiring substrate 1. This results in a problem with the reliability of the electrical connection.

The presence of such voids V can be determined, as shown in FIG. 9, by applying a vertical tensile force P to separate the IC chip 31 from the wiring substrate 1 sufficient to break the solder 33 connecting the pads 11 and 32. The broken surface of the solder 33 is then observed. When the voids V are not present, the solder 33 subjected to the tensile force P elongates and breaks forming sharp points upon breakage as shown in FIG. 10. By contrast, when the voids V are present, the solder 33 breaks before sharp points are formed and fine craters K are observed in the broken surface, proving the presence of the voids V. Conventionally, 150 to 350 craters of this kind have been observed for 1,000 pads.

As mentioned above, the metal layer constituting the pad 11 of the wiring substrate 1 is plated with nickel. Conventionally, from the viewpoint of corrosion resistance, the necessary and sufficient thickness of this plating is said to be approximately 1 µm. If the plating is excessively thick, the metal layer becomes highly likely to separate from the substrate surface due to internal stress generated after plating. Further, in view of production efficiency represented by plating manhours (or plating time), cost, or like factors, an appropriate plating thickness was normally 1.5 µm or below. Accordingly, the standard plating thickness was in the range of from 1 µm to 1.5 µm.

The present inventors thought that if the thickness of the nickel plating layer of the pad 11 of the wiring substrate 1 is in the range of 1 µm to 1.5 µm, which has been conventionally considered as an appropriate, the base metal layer would not be covered completely, so that the metal layer would be partially exposed and residual plating solution trapped in any exposed portions may cause the generation of a void. The inventors checked the surface of the pad 11 after nickel plating and observed that components of the base metallization layer 4, namely tungsten (W), molybdenum (Mo), fine ceramic grains, as of $Al_2O_3$, and glass frit, were slightly exposed through the nickel plating layer 5 to form pinholes, as shown in FIG. 12.

In order to prevent such an exposure of the metal layer 4, the present inventors repeatedly conducted the above tensile test on wiring substrate samples having different thicknesses of nickel plating layer 5 and to which IC chips were flip-chip bonded. The examination of broken surfaces of solder of,the tensile tested samples revealed that the thickness of the nickel plating layer 5 in a certain range provided a significantly reduced rate of generation of voids.

SUMMARY OF THE INVENTION

The present invention has been achieved based on the above finding, and an object of the present invention is to provide a wiring substrate formed from a ceramic member in which a metal layer constituting electrode pads is formed from a high melting-point metal, whose main components are tungsten, molybdenum, and manganese, and is plated with nickel in an appropriate plating thickness to thereby reduce the generation of voids in the bonding solder thereby improving the reliability of the electrical connection.

To achieve the above object, the present invention provides a wiring substrate which is formed from a ceramic member having electrode pads to which an electrical component like an IC chip is connected through soldering and in which a metal layer constituting each of the electrode pads is plated with nickel, wherein the thickness of the nickel plating is in the range of from 2.5 µm to 8 µm.

Accordingly, the nickel plating layer of the present invention completely covers the metal layer preventing any exposure of previous layers through the nickel plating layer. Therefore, no pinhole or the like in which a plating solution may remain is formed, and the nickel plating layer is completely plated with Au. Thus, in the subsequent steps of forming solder bumps and of soldering, solder-nonwetting does not occur, so that the generation of voids in solder connecting pads of an IC chip and pads of a wiring substrate is significantly reduced.

The present invention employs a thickness of the nickel plating layer of 2.5 µm or more, since a thickness of less than 2.5 µm allows partial exposure of the base metal layer through the nickel plating layer; in other words, pinholes are formed in the nickel plating layer and result in solder-nonwetting, which, in turn, results in void formation. When the thickness of the nickel plating layer is in excess of 8 µm, the adhesion of the base metal layer deteriorates or becomes defective (the metal layer may separate from the substrate or crack) due to internal stress generated in the nickel plating layer during plating and a difference in coefficient of thermal expansion between the nickel plating layer and the base metal layer or the ceramic substrate. Thus, the reliability of connection is highly likely to be impaired. In the present invention, the thickness of the nickel plating layer is 2.5 μm to 8 μm, preferably 3 μm to 7 μm. Through employment of a thickness within this range, the generation of voids in solder of flip-chip bonded pads is reduced, and a potential separation of the base metal layer associated with an internal stress is avoided almost completely. Accordingly, the reliability of the electric connection is embodied significantly improved.

Electrically independent pads are plated with nickel through electroless plating or barrel plating, whereas mutually electrically connected pads can be plated through electrolytic plating. In either case, the thickness of plating is 2.5 μm to 8 μm, preferably 3 μm to 7 μm. This nickel plating also includes Ni alloy plating such as Ni-B plating, Ni-P plating, and Ni-Co plating.

When electroless plating is employed for forming a nickel plating layer, at least the outermost surface of the nickel plating layer is formed of Ni-B plating. Preferably, the entire nickel plating layer is formed of Ni-B plating, but the nickel plating layer may be composed of a lower Ni-P plating layer and a surface Ni-B plating layer. This is because an Ni-B plating layer shows excellent soldering wettability.

There may be employed a design in which no layer is provided on a nickel plating layer. However, the nickel plating layer is preferably plated with Au to a thickness of 0.01 μm to 1 μm, more preferably 0.03 μm to 0.1 μm. The Au plating layer prevents oxidization of the surface of the nickel plating layer serving as a base layer (hereinafter referred to as "base nickel plating layer" or "base nickel (layer)") to thereby improve and stabilize soldering wettability of the nickel plating layer. The Au plating layer should have a thickness of 0.01 μm or more in order to sufficiently prevent oxidization. Meanwhile, when Pb-Sn solder or a bump (terminal) is formed on a pad, and the pad is connected to the opposite pad, Au promptly diffuses into the solder to produce a fragile intermetallic compound with tin(Sn). When the thickness of the Au plating layer is greater than 1 μm, a large amounts of Au diffuse into the solder between the pads, resulting in formation of an excessive amount of an intermetallic compound, and in turn results in a reduction in the strength of the solder bump itself and the joint strength between the solder bump and the pads. Accordingly, the Au plating layer preferably has a thickness in the range of 0.01 to 1 μm, more preferably, 0.03 to 0.1 μm. Within this range, the above-described oxidation is sufficiently prevented, and an intermetallic compound between solder and Au is produced in a smaller amount.

Preferably, nickel that constitutes the base nickel layer is caused to diffuse into the Au plating layer before formation of the solder bump. Specifically, a gold-nickel layer which contains gold as a main component and nickel as an additive and which has a thickness of 0.01 to 1.0 μm is. preferably formed on the above-described nickel plating layer. Formation of such gold-nickel layer reduces the generation of voids, and increases the contact (joint) strength of solder (or a solder bump) and the strength of solder itself.

The reason formation of a gold-nickel layer reduces the generation of voids is considered to be as follows. In the case of a pad in which Au is simply plated on the nickel plating layer to form a gold plating layer, Au is precipitated on nickel through substitution reaction immediately after gold plating. In this case, the gold-plated layer and the nickel plated layer are considered to be in close contact (considered to have reacted) with each other through a small area. Therefore, when Pb-Sn solder is caused to fuse and join with the gold plating, gold diffuses into the solder at a speed faster than does solder into the nickel plating layer. This unbalance in diffusion speed causes generation of voids in the solder. In contrast, in the case of a gold-nickel layer, nickel contained therein suppresses or prevents the diffusion of gold into the solder, thus decreasing the speed of diffusion of gold into the solder. Thus, the problem of unbalance in diffusion speed is solved, and consequently, formation of voids in solder is prevented.

Further, when gold plating is merely formed on the nickel plating layer, gold quite easily fuses and diffuses into the solder during soldering, so that the solder and the base nickel layer come into direct contact with each other and become connected. In contrast, when a gold-nickel layer is formed on the nickel plated layer, nickel contained in the gold-nickel layer restricts (or suppresses) diffusion of gold into the solder, so that the solder does not come into direct contact with the base nickel layer, but comes into contact with the gold-nickel layer. Compared with the case of contact with the base nickel layer, solder comes into contact with the gold-nickel layer more closely, and formation of an intermetallic compound is suppressed. Therefore, the joint strength and the strength of solder itself increase accordingly. That is, since nickel contained in the gold-nickel layer effectively restricts fusion into solder of gold contained in the gold-nickel layer, high joint strength is obtained. Accordingly, breakage of solder joined to pads after the establishment of the connection, which would otherwise occur due to shear force generated between the pads, is prevented.

In the case where a gold-nickel layer is formed instead of a gold layer as described above, the gold-nickel layer is preferably formed to a thickness of 0.01 to 1.0 μm. Nickel is preferably contained in the gold-nickel layer in amount of 10 to 80 percent by atom, because when the nickel content of the gold-nickel layer falls within this range, the number of generated voids can effectively be reduced.

The gold-nickel layer is preferably formed on a metal layer that constitutes each electrode pad in accordance with a method in which gold is plated on the base nickel plating layer, and the gold plating layer is subjected to heat treatment at a predetermined temperature in order to allow nickel to diffuse into the gold plating layer. The reason heat treatment is used for nickel diffusion is that heat treatment itself is easy to perform and an amount of diffused nickel (nickel content) can be easily controlled through adjustment of the temperature and time of heat treatment. In addition, plating solution contained within a plating film can be gasified and removed, and the heat treatment can suppress the generation of voids in solder more effectively.

The maximum temperature of the heat treatment for formation of the gold-nickel layer through diffusion is preferably in the range of 150 to 750° C. When the temperature is lower than 150° C., sufficient effect; i.e., sufficient reduction of the number of voids generated in solder, cannot be achieved because of insufficient diffusion of nickel. In contrast, when the temperature is higher than 750° C., the nickel content of the gold-nickel layer becomes excessive due to excessive diffusion of nickel. In other words, the gold content at the surface of each pad becomes excessively low, and the oxidation prevention effect of gold cannot be obtained. In order to solve these drawbacks more effectively, the heat treatment temperature is more preferably set to fall within the range of 350 to 550° C.

In the manufacture of a wiring substrate according to the present invention, including the case where a gold plating layer or a gold-nickel plating layer is formed on a nickel plating layer, nickel plating is performed in a plurality of steps such that the overall thickness of the nickel plating layer is in the range of from 2.5 $\mu$m to 8 $\mu$m, preferably 3 $\mu$m to 7 $\mu$m. Although the nickel plating. layer having a predetermined thickness may be obtained in a single step of plating, the nickel plating layer is preferably formed in a plurality of steps of plating to thereby comprise a plurality of nickel plating sub-layers. By forming the nickel plating layer having a predetermined thickness in a plurality of steps of plating rather than in a single step of plating, the base metal layer is covered with the nickel plating layer substantially completely. Accordingly, the generation of voids in solder of bonded pads is effectively reduced further.

In view of plating workability, when a nickel plating layer is formed in a plurality of steps of plating as described above, plating is preferably performed such that each of nickel plating sub-layers has substantially a constant thickness. In order to stabilize adhesion of plating and relieve internal stress generated within a plating layer, at least a single heating step is preferably inserted somewhere among a plurality of nickel plating steps; more preferably, a heating step is carried out after each nickel plating step is completed. This effectively prevents plating from blistering or the base metallization layer from separating from a wiring substrate.

BRIEF DESCRIPTION OF THE DRAWINGS

Various other objects, features and many of the attendant advantages of the present invention will be readily appreciated as the same becomes better understood by reference to the following detailed description of the preferred embodiment when considered in connection with the accompanying drawings, in which.

DESCRIPTION OF THE PREFERRED EMBODIMENT

Figure 1:
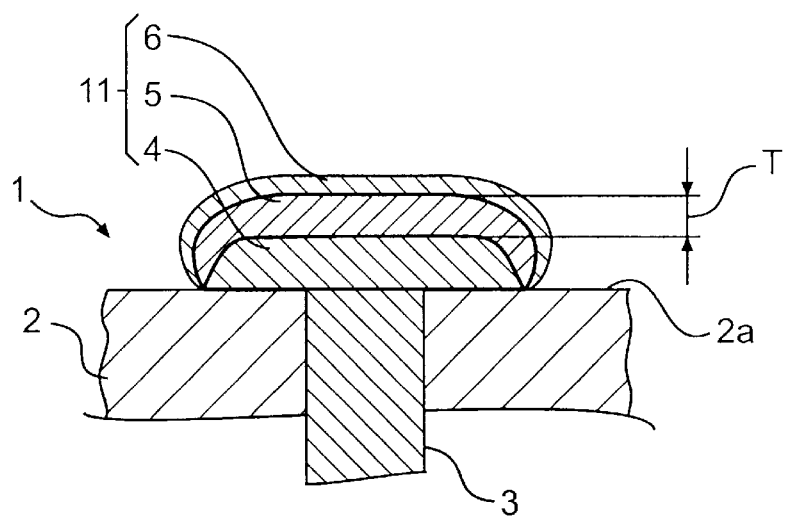
FIG. 1 is an enlarged sectional view showing a pad portion of a wiring substrate according to an embodiment of the present invention.
Figure 2:
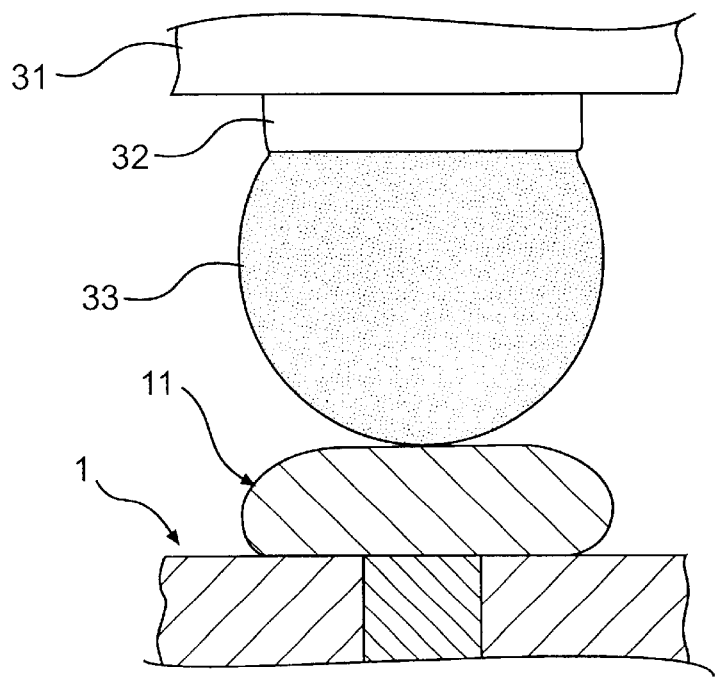
FIG. 2 is an enlarged sectional view showing a pad of the wiring substrate of FIG. 1 and a pad of a flip-chip bonding type IC chip which are aligned with each other in preparation for reflowing.
Figure 3:
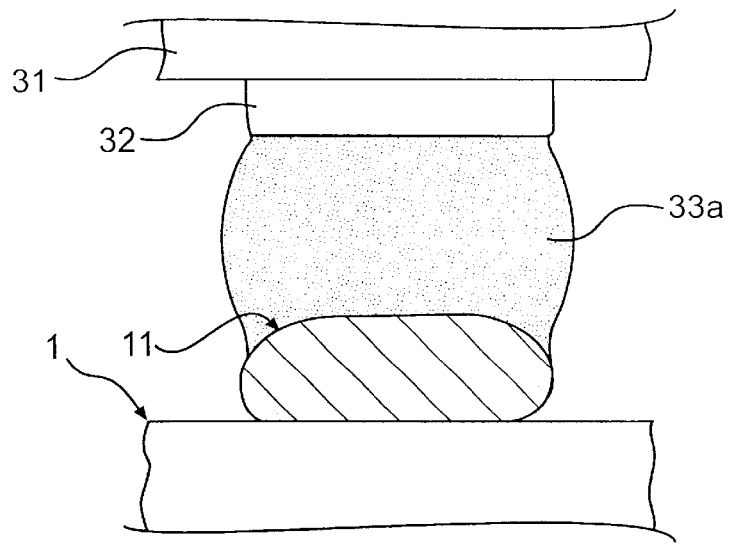
FIG. 3 is an enlarged sectional view showing the pad of the wiring substrate and the pad of the IC chip of FIG. 2 which are flip-chip bonded together through reflowing.

An embodiment of the present invention will be described with reference to FIGS. 1 to 3. In FIG. 1, reference numeral 1 denotes a wiring substrate (only a pad portion is shown in section) to which a flip-chip bonding type IC chip is connected. A number of metal layers 4, 5, and 6 serving as pads 11 connected to vias 3 are form on one main surface 2a of a ceramic substrate 2 formed from alumina ceramic through firing together with the substrate 2. Metal layer 4 is covered, for example, through electroless plating, with a nickel plating layer 5 composed of a Ni-B plating layer in a thickness (T) of 2.5 $\mu$m to 8 $\mu$m. The nickel plating layer 5 is covered with, for example, an Au plating layer 6 having a thickness of approximately 0.05 $\mu$m to 0.1 $\mu$m. Thus is formed the pad 11.

In such wiring substrate 1, the base metal layer 4 of the pad 11 is substantially completely covered with the nickel plating layer 5. As shown in FIG. 2, the flip-chip bonding type IC chip 31 is placed on the wiring substrate 1 such that the pads 32 are aligned with the corresponding pads 11. Then, the high melting-point solder bumps 33, which are provided, for example, on the pads 32, are caused to reflow to thereby solder the pads 11 and 32. In the thus-established solder 33a, voids are hardly present, so that a resultant flip-chip bonded semiconductor device has a highly reliable electric connection.

Figure 9:
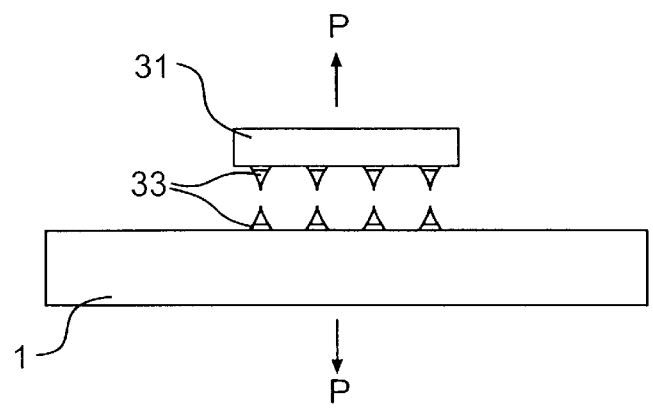
FIG. 9 is a front view illustrating the separation of an IC chip from a wiring substrate.
Figure 10:
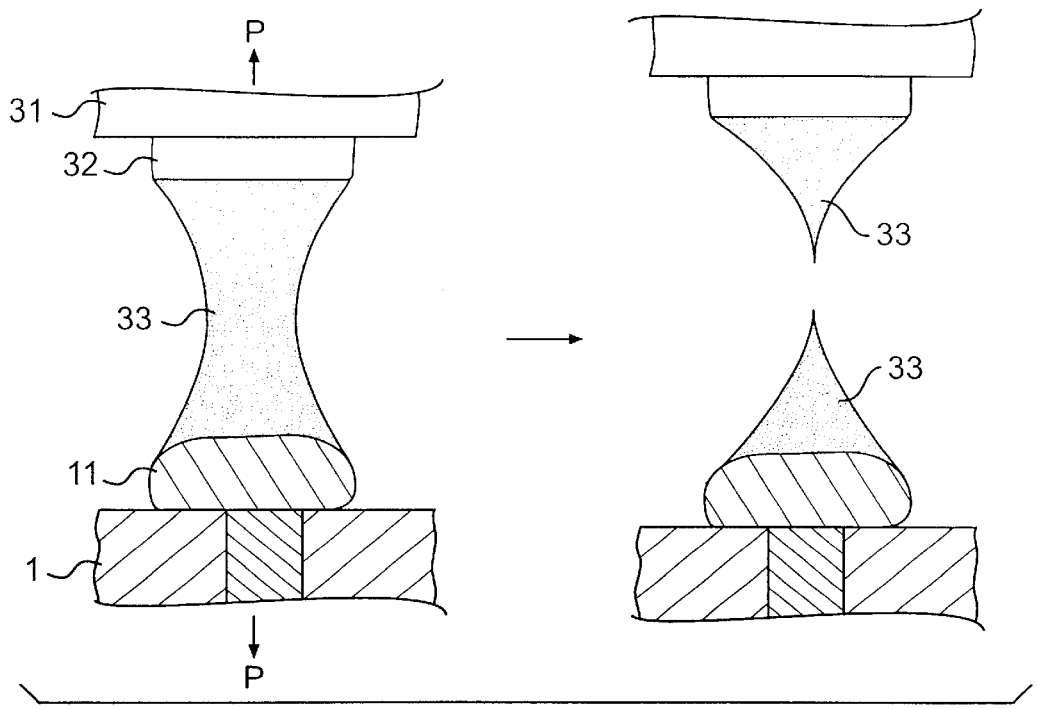
FIG. 10 is a view illustrating the breaking of void-free solder in a test of separating an IC chip from a wiring substrate.
Figure 11:
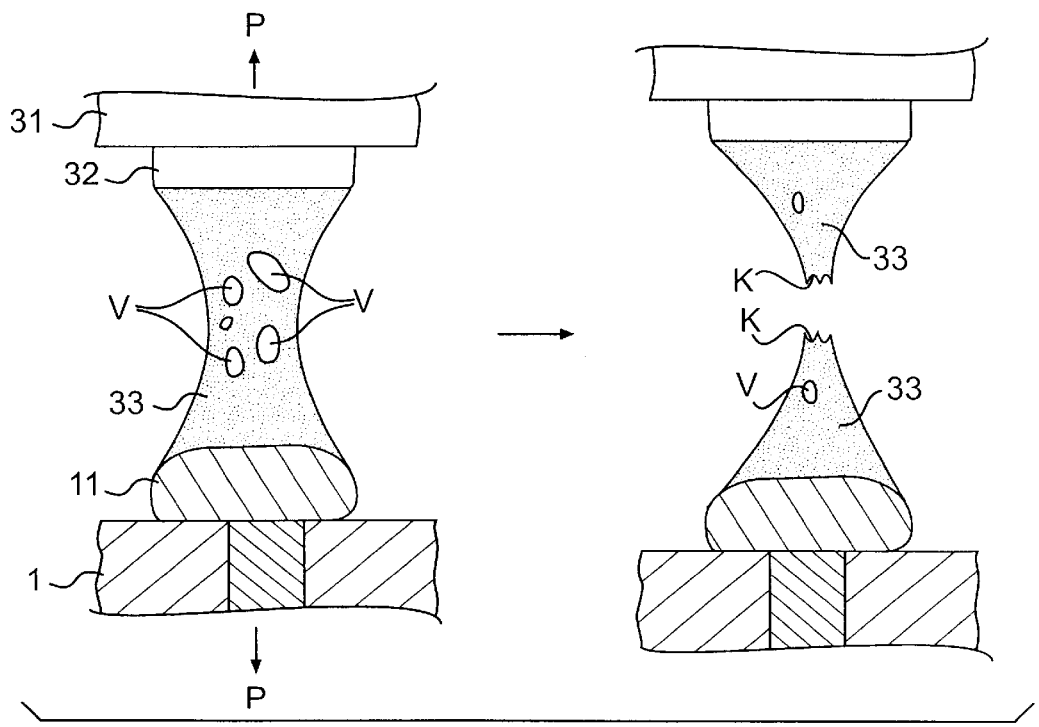
FIG. 11 is a view illustrating the breaking of solder suffering voids in a test of separating an IC chip from a wiring substrate.
Figure 12:
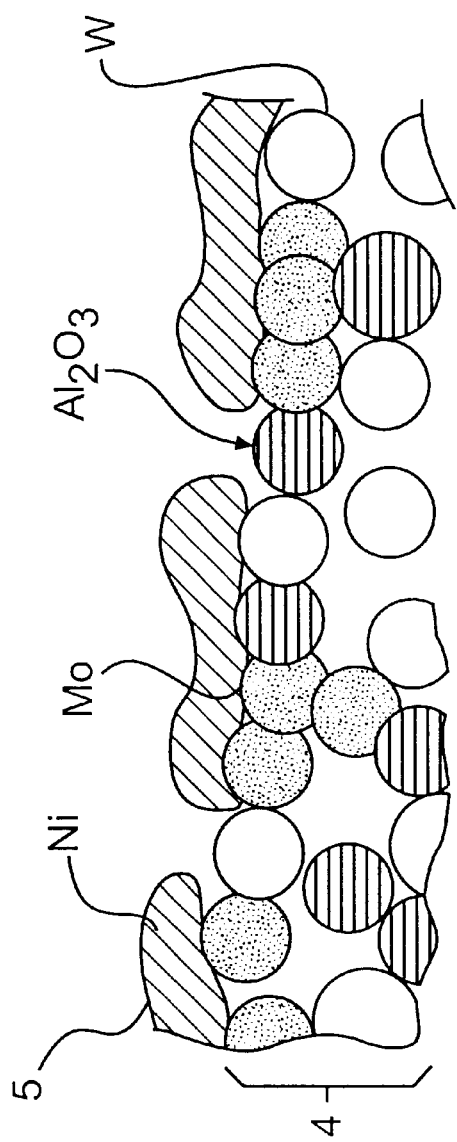
FIG. 12 is a schematic sectional view illustrating the exposure of a metallization layer through an overlying nickel plating layer having a thickness of 1 $\mu$m to 1.5 $\mu$m in a conventional wiring substrate wherein the metallization layer constitutes an electrode pad.

10 flip-chip bonding type BGA wiring substrates, each having 100 pads 11 (1000 pads in total), were made as samples 1. The samples were different in the thickness (T) of the nickel plating layer 5. The IC chips 31 were flip-chip bonded to the wiring substrates 1; specifically, the pads 11 and the pads 32 of the IC chips 31 were soldered through use of high melting-point solder (97Pb-3Sn). While the present invention has been disclosed in terms of an embodiment using a high melting-point solder of 97Pb-3Sn, the invention is operable and advantageous with other solder compositions. It is particularly useful with tin (Sn) containing solders. As shown in FIG. 9, the wiring substrate 1 and the IC chip 31 were pulled apart from each other by applying a force perpendicular to their surfaces. The thus-broken surface of the solder 33a was examined through a 20× magnifier for voids (the number of pads in which a crater (s) is present). Also, the samples 1 were examined for the separation of the base metal layer 4 covered with the nickel plating layer 5 from the substrate 2 (the number of pads in which a crack is formed between the base metal layer 4 and the substrate 2) and for the relation between this separation and the thickness (T) of the nickel plating layer 5.

Each of the 10 ceramic substrates 2 was made from alumina and had a size of 25 mm×25 mm×1.0 mm (thickness). The base metal layer 4 of the pads 11 was arranged in 10 columns×10 rows at a pitch of 0.3 mm. Metal later 4 had a circular shape of a 0.14 mm diameter. The metal layer 4 was plated with Ni-B through electroless plating. This plating was carried out at a single step to obtain a Ni-B plating layer 5 having a thickness of 1 to 8.2 $\mu$m. In order to stabilize adhesion, the samples were heat-treated at 570° C. in an $H_2$ atmosphere. Subsequently, the plated metal layers 4 and 5 were further plated with Au through electroless plating to obtain an Au plating layer 6 having a thickness of 0.05 $\mu$m. In this case, heat treatment or the like for diffusing nickel into the Au plating layer 6 was not performed after the Au plating. Subsequently, flux was applied onto the thus-formed pads 11 of the wiring substrates 1. Then, the IC chips 31 (5.0×5.0 mm×0.75 mm (thickness), solder bump diameter 0.16 mm, solder bump height 0.1 mm) were placed on the respective wiring substrates 1 in an aligned manner. These substrate-element assemblies were exposed to the $N_2$ atmosphere having a maximum temperature of 370° C. to cause the solder bumps to reflow, thereby establishing flip-chip bonding.

TABLE 1

Nickel Plating Thickness vs. Number of Pads Suffering Voids and Number of Pads Suffering Separation of Metallization Layer
(Total number of pads: 1000)

| Thickness T of nickel plating layer ($\mu$m) | Pads suffering voids | Pads suffering separation from base metal layer |
|---|---|---|
| *1.0 | 296 | 0 |
| *2.0 | 158 | 0 |
| 2.5 | 90 | 0 |
| 3.0 | 74 | 0 |
| 3.5 | 62 | 0 |
| 4.0 | 58 | 0 |
| 5.0 | 49 | 0 |
| 6.0 | 55 | 0 |
| 7.0 | 52 | 0 |
| 7.7 | 63 | 96 |
| *8.2 | Not measured | 563 |

*Comparative Example

Figure 4:
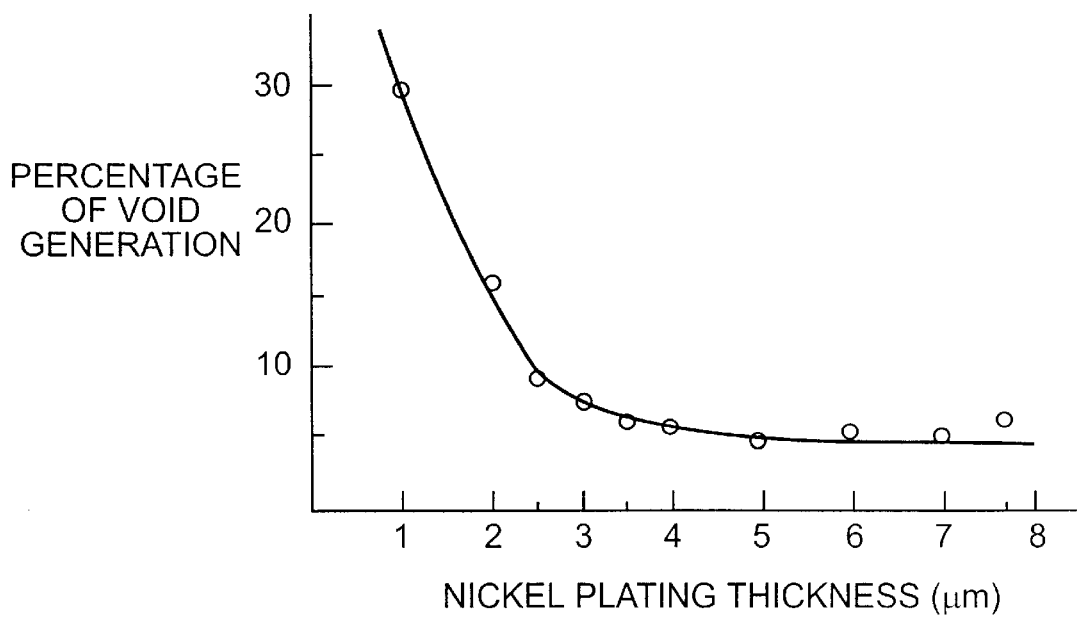
FIG. 4 is a graph showing the relation between a nickel plating thickness and the percentage of void generation.

As seen from Table 1, pads suffering voids (craters) account for approximately 15% to 30% of all pads for a nickel plating thickness (T) of 1 $\mu$Am and 2 $\mu$m, whereas the percentage is as low as 10% or less for the nickel plating thickness rage of the present invention, specifically from 2.5 $\mu$m to 8 $\mu$m. Particularly for a nickel plating thickness of 3 $\mu$m or more, the percentage is as low as 7.4%. FIG. 4 graphs the relation between the nickel plating thickness (T) and the percentage of void generation (%). As seen from this graph, as the thickness (T) of the nickel plating layer 5 increases, the generation of voids is more effectively prevented. However, as mentioned previously, when the nickel plating layer 5 is excessively thick, the base metal layer 4 becomes highly susceptible to separation or cracking.

In view of the relation between the thickness (T) of the nickel plating layer 5 and the number of pads suffering the separation of the base metal layer 4 as shown in Table 1, it is preferable that the thickness (T) of the nickel plating layer 5 be 7 $\mu$m or less. In Table 1, for a nickel plating thickness (T) of 7 $\mu$m and 7.7 $\mu$m, the number of pads suffering voids is the number of those pads which suffer voids, but are free from separation. For a nickel plating thickness (T) of 8.2 $\mu$m, samples were not examined for pads suffering voids, since pads suffering the separation of the metal layer accounted for more than half the all pads. Judging from these test results, it is appropriate that a design thickness of the nickel plating layer 5 be set to 3.2 $\mu$m to 3.5 $\mu$m and that a nickel plating thickness of 3 $\mu$m to 7 $\mu$m be considered acceptable.

After the above-described samples were subjected to electroless plating to form on the nickel plating layer an Au plating layer having a thickness of 0.05 $\mu$m, the samples were heat-treated at a predetermined temperature (highest temperature: 150 to 850° C.) in a hydrogen atmosphere in order to cause nickel in the base nickel layer to diffuse into the Au plating layer 6. In this way, there were manufactured samples in which a gold-nickel layer was formed on the base nickel layer 5. After the nickel content (nickel diffusion amount) of the gold-nickel layer was confirmed by an Auger electron analysis, an IC chip 31 was flip-chip bonded to each sample under the same conditions as those described above. Subsequently, the number of generated voids was examined through the same test (chip separation test) and examination method. The results are shown in Table 2.

The analysis and measurement of the nickel (Ni) content were performed through use of an Auger electron analyzer JAMP-30 (product of JOEL) under the following conditions: acceleration voltage=10 kV; irradiation current=3×10$^{-7}$ mA; and spot diameter (analyzing area)=50 $\mu$m. Under these conditions, there is obtained information of a measured sample in a region from the top surface of the sample to a depth of about 50 angstroms (0.005 $\mu$m). For each heat treatment temperature, the Ni content (percent by atom) of each of three samples (wiring substrates) was measured. In each sample, the center surface of the gold-nickel layer of a freely selected pad 11 was measured at three points (three locations). Table 2 shows the average values for each of these nine measured values.

TABLE 2

Heat Treatment Temperature, Number of Voids Generated, and Ni-content for the Case where after One Step of Nickel Plating, Gold-Nickel Layer Was Formed through Gold Plating and Subsequent Heat Treatment

| Sample No. | Heating temperature (° C.) | Number of voids generated | Ni content (atomic %) |
|---|---|---|---|
| 1* | Not heat treated | 69 | 0 |
| 2 | 150 | 46 | 10.2 |
| 3 | 250 | 48 | 11.7 |
| 4 | 350 | 28 | 26.2 |
| 5 | 450 | 25 | 20.3 |
| 6 | 550 | 29 | 29.3 |
| 7 | 650 | 39 | 27.7 |
| 8 | 750 | 48 | 75.0 |
| 9* | 850 | 426 | 91.8 |

Note 1: Samples indicated by sample numbers with * are Comparative Examples.
Note 2: Number of voids generated represents the total number of voids generated in all pads (1000).
Note 3: Number of samples for which Ni content was measured was three for each sample number, and measurement was performed at three locations in each sample (nine measured values represent average values).

As shown in Table 2, among heat-treated samples, each of the samples 2 to 8 had a reduced number of generated voids compared to the sample (sample No. 1) that had not heat treated. Although the cause was not clear, the sample (sample No. 9) that had been heat-treated at 850° C. had a larger number of voids. This test result shows that the preferable temperature range for heat treatment is 150 to 750° C. Most preferably the temperature is in the range of from 350 to 450° C. with the time at 350° C. being about 30 minutes and the time at 450° C. being about 10 minutes, not including the heat-up time to get to the preferred maximum temperature. Most The Ni content of the sample that had not been heat treated was zero, whereas the Ni content of the samples that had been heat treated at temperatures of 150 to 750° C. was in the range of 10 to 80 percent by atom. This test result shows that when a gold nickel layer is formed through a process other than heat treatment, such as chemical vapor deposition, the gold-nickel layer is preferably formed such that the nickel content thereof falls in the range of 10 to 80 percent by atom. The number of voids generated in the sample No. 1 was slightly (about 12%) greater than that shown in Table 1.

Next will be described the relation between the number of steps of nickel plating and the generation of voids in the manufacture of wiring substrates. Test samples were made in a manner similar to that of the above-described test except that nickel plating and heat treatment for preventing generation of blister and separation of the underlying metallization layer were repeated a plurality of times, and gold (thickness: 0.05 $\mu$m) was plated through electroless plating (see FIG. 5), so that a plating layer composed of a plurality of sub-layers was formed. Also, samples were examined for pads suffering voids in a manner similar to that of the above-described test. In order to prevent plating from blistering or the base metallization layer from separating from a substrate, heat treatment was carried out through exposure to an $H_2$ atmosphere having a maximum temperature of 570° C. each time nickel plating was completed. These conditions were the same as those in the following examples.

First will be described the case where Ni-B plating was performed in two steps to obtain the nickel plating layer 5 having a predetermined thickness (T). The results are shown in Table 3. Sample wiring substrates were manufactured in a manner and a quantity similar to those of the above-described test. Accordingly, the total number of pads was 1000. This is also applicable to the tests described below.

TABLE 3

Nickel Plating Layer Formed in 2 Steps of Plating
Nickel Plating Thickness vs. Number of Pads Suffering Voids and
Number of Pads Suffering Separation of Metallization Layer
(Total number of pads: 1000)

| Thickness T of | Thickness of 1st | 2nd | Pads suffering | Pads |
|---|---|---|---|---|
| *1.3 | 0.6 | 0.7 | 176 | 0 |
| *2.0 | 1.0 | 1.0 | 109 | 0 |
| 2.5 | 1.2 | 1.3 | 63 | 0 |
| 3.9 | 1.8 | 2.1 | 26 | 0 |
| 5.7 | 2.8 | 2.9 | 31 | 0 |
| 7.4 | 3.6 | 3.8 | 29 | 0 |
| *8.4 | 4.0 | 4.4 | Not measured | 132 |

*Comparative Example

Figure 6:
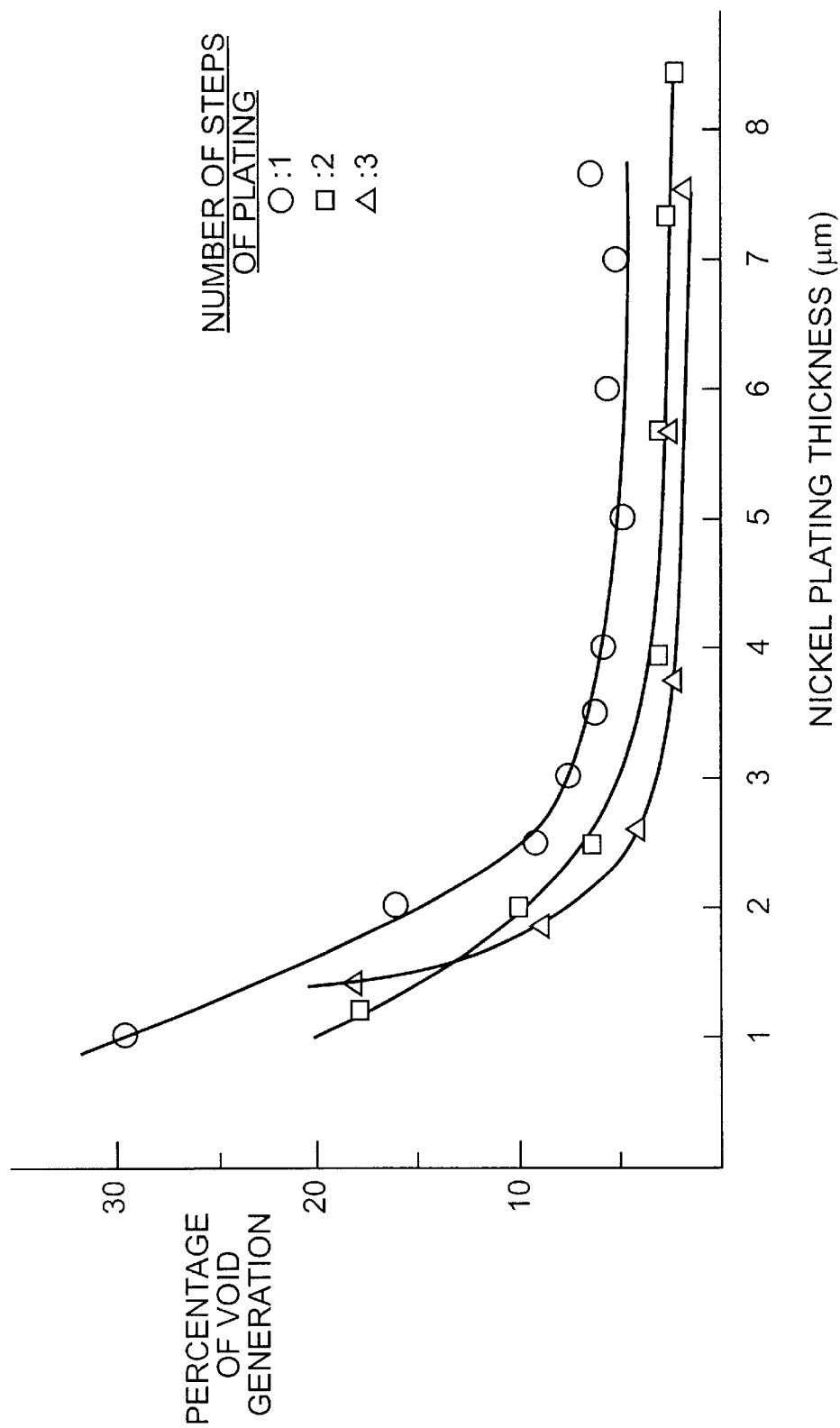
FIG. 6 is a graph showing the relation between the percentage of void generation and a nickel plating thickness with the number of steps of plating as a parameter, comparing the test results among Tables 1, 3, and 4.
Figure 7:
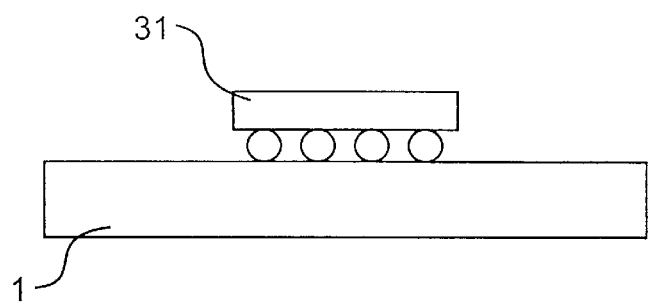
FIG. 7 is a schematic front view showing a semiconductor device composed of a wiring substrate and an IC chip which are flip-chip bonded together.
Figure 8:
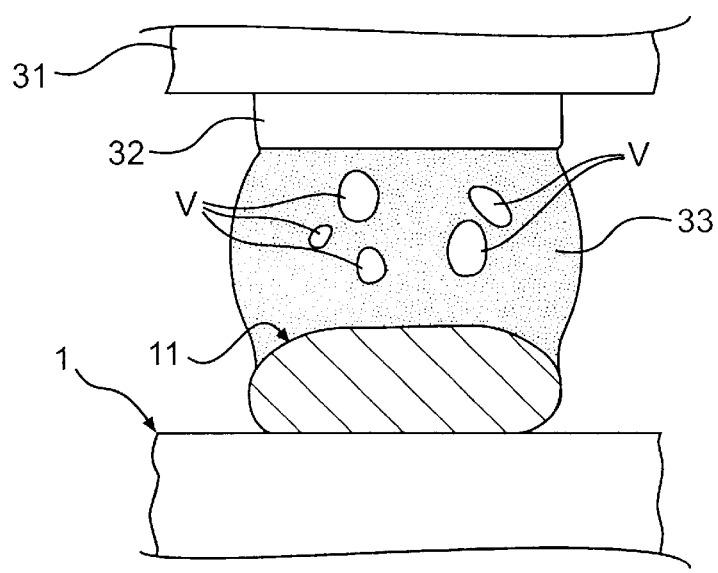
FIG. 8 is an enlarged sectional view illustrating the state of solder connection between pads of the device of FIG. 7.

As see from Table 3 and FIG. 6, the number of pads suffering voids was smaller than that of the above-described case (Table 1) where the nickel plating layer 5 having a predetermined thickness was formed in a single step of plating. This implies that the base metal layer 4 was covered better with the nickel plating layer 5 formed in two steps of plating than in a single step of plating. Even though plating was performed in two steps, in the comparative Examples wherein the thickness of the nickel plating layer 5 was not greater than 2 $\mu$m, the number of pads suffering voids was still large. In the Comparative Example wherein the thickness of the nickel plating layer 5 was 8.4 $\mu$m, the separation of the metal layer 4 from the substrate 2 occurred with approximately 13% of the test pads, so that samples were not examined for pads suffering voids.

Next will be described the case where Ni-B plating was performed in three steps to obtain the nickel plating layer 5 having a predetermined thickness (T). However, heat treatment (nickel diffusion) was not performed after gold plating. The results are shown in Table 4.

TABLE 4

Nickel Plating Layer Formed in 3 Steps of Plating
Nickel Plating Thickness vs. Number of Pads Suffering Voids and
Number of Pads Suffering Separation of Metallization Layer
(Total number of pads: 1000)

| Thickness T of | Thickness of 1st | 2nd | 3rd | Pads | Pads suffering |
|---|---|---|---|---|---|
| *1.4 | 0.4 | 0.5 | 0.5 | 188 | 0 |
| *1.9 | 0.6 | 0.7 | 0.6 | 96 | 0 |
| 2.6 | 0.8 | 1.0 | 0.8 | 43 | 0 |
| 3.8 | 1.4 | 1.2 | 1.2 | 23 | 0 |
| 5.7 | 1.9 | 2.0 | 1.8 | 29 | 0 |
| 7.5 | 2.6 | 2.3 | 2.6 | 22 | 0 |
| *8.7 | 2.6 | 3.0 | 3.1 | Not measured | 98 |

*Comparative Example

As see from Table 4 and FIG. 6, the number of pads suffering voids was smaller than that of the above-described case where the nickel plating layer 5 having a predetermined thickness was formed in two steps of plating. Even though plating was performed in three steps, in the comparative Examples wherein the thickness of the nickel plating layer 5 was not greater than 1.9 $\mu$m, the number of pads suffering voids was still large. In the Comparative Example wherein the thickness of the nickel plating layer 5 was 8.7 $\mu$m, the separation of the metal layer 4 from the substrate 2 occurred with approximately 10% of the test pads, so that samples were not examined for pads suffering voids. Judging from these test results, it is appropriate that even in the case of forming the nickel plating layer 5 in a plurality of steps of plating, the total thickness (T) of nickel sub-layers constituting the nickel plating layer 5 be 2.5 $\mu$m to 8 $\mu$m, more preferably 3 $\mu$m to 7 $\mu$m in view of safety.

After the nickel plating layer was formed through three steps of plating, the samples were subjected to electroless plating to form an Au plating layer having a thickness of 0.05 $\mu$m on the nickel plating layer, and were heat treated at a predetermined temperature (highest temperature: 150 to 850° C.) in a hydrogen atmosphere in order to cause nickel in the base nickel layer to diffuse into the Au plating layer 6. In this way, there were manufactured samples in which a gold-nickel layer was formed on the base nickel layer. Subsequently, an IC chip was flip-chip bonded to each sample, and the number of generated voids was examined in the same manner as that described above. However, nickel was plated to thicknesses of 1.4 $\mu$m, 1.2 $\mu$m, and 1.3 $\mu$m, in first third plating steps in order to obtain a total of 3.8 $\mu$m. The results are shown in Table 5.

TABLE 5

Heat Treatment Temperature, Number of Voids Generated, and
Ni-content for the Case where after 3 Steps of Nickel
Plating, Gold-Nickel Layer Was Formed through Gold Plating and
Subsequent Heat Treatment

| Sample No. | Heating temperature (° C.) | Number of voids generated | Ni content (atomic %) |
|---|---|---|---|
| 1* | Not heat treated | 28 | 0 |
| 2 | 150 | 20 | 18.5 |
| 3 | 250 | 16 | 22.8 |
| 4 | 350 | 8 | 20.8 |
| 5 | 450 | 11 | 26.2 |
| 6 | 550 | 8 | 24.8 |
| 7 | 650 | 12 | 25.2 |
| 8 | 750 | 21 | 61.1 |
| 9* | 850 | 249 | 85.9 |

Note 1: Samples indicated by sample numbers with * are Comparative Examples.
Note 2: Number of voids generated represents the total number of voids generated in all pads (1000).
Note 3: Number of samples for which Ni content was measured was three for each sample number, and measurement was performed at three locations in each sample (nine measured values represent averaged values).

Figure 5:
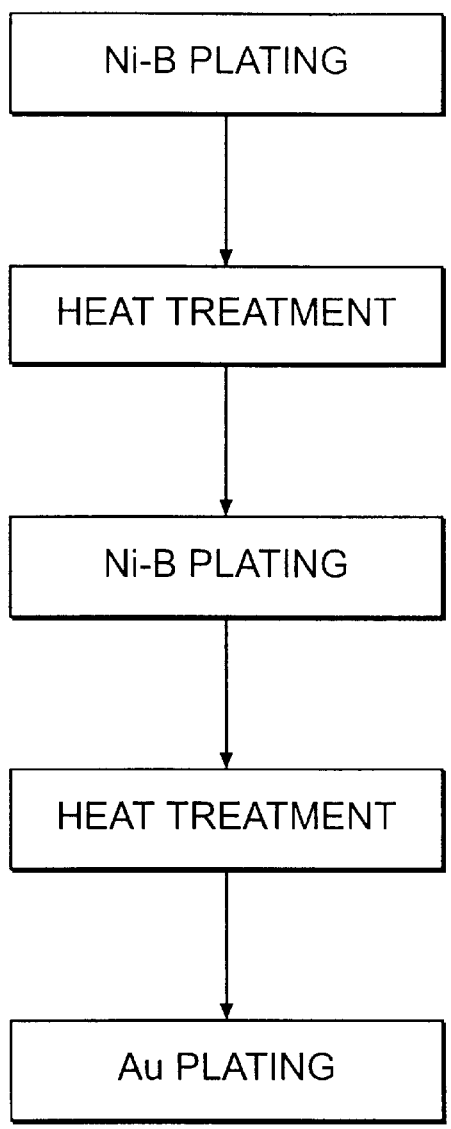
FIG. 5 is a flowchart showing Ni-B plating to be performed in a plurality of steps.

As shown in FIG. 5, a test for samples in which a gold-nickel layer had been formed through gold plating and heat treatment after formation of a nickel plating layer through three steps of plating produced substantially the same results as those obtained in the test for samples in which a gold-nickel layer had been formed through gold plating and heat treatment after formation of a nickel plating layer through a single step of plating. That is, among heat-treated samples, each of the samples 2 to 8 had a reduced number of generated voids compared to the sample (sample No. 1) that had not been heat treated. Although the cause was not clear, the sample (sample No. 9) that had been heat-treated at 850° C. had a larger number of voids. This test result again demonstrates that formation of a gold-nickel layer on the nickel plating layer is effective in reducing the number of voids generated in solder, and also shows that the preferable temperature range for heat treatment is 150 to 750° C. The Ni content of the sample that had not been heat treated was zero, whereas the Ni content of the samples that had been heat treated at temperatures of 150 to 750° C. was in the same range as in the above-described example (i.e., 10 to 80 percent by atom). The number of voids generated in the sample No. 1 was slightly (about 22%) greater than that shown in Table 4.

Table 6 shows the relation among a nickel plating count (and nickel plating thickness), the number of pads suffering voids, and the number of pads suffering the separation of the base metallization layer from the substrate.

In the case where a gold-nickel layer is formed by gold plating and subsequent diffusion of nickel from the base nickel layer into the gold plating layer, the gold-nickel layer effectively prevents oxidation and generation of voids. Therefore, the gold plating layer formed on the nickel plating layer is preferably heat-treated to convert the gold plating layer into a gold-nickel layer. The method of forming a gold-nickel layer is not limited to the above-described method in which after gold plating, an entire wiring substrate is subjected to heat treatment in order to allow nickel to diffuse from the base nickel layer to the gold layer. That is, the gold-nickel layer may be formed in a manner in which after gold plating, a laser beam or electron beam is radiated onto pads to heat the pads only, to thereby allow nickel to diffuse into the gold plating layer. In this case, since nickel does not diffuse into areas where soldering is not performed, the high oxidation-resistance of these areas is maintained. Moreover, although a gold-nickel layer is formed through nickel diffusion performed after gold plating in the above-described embodiments, the method of forming the gold-nickel layer is not limited thereto. For example, a gold-nickel layer may be formed by a method in which gold and nickel are simultaneously deposited on pads through vapor phase epitaxy such as spattering.

A wiring substrate of the present invention may be of any type of connection to a printed circuit board (external circuit board) so long as a chip having a number of electrode pads on its entire surface, such as a flip-chip bonding type IC chip, can be mounted thereon. Examples of such types of

TABLE 6

Nickel Plating Count and Nickel Plating Thickness vs.
Number of Pads Suffering Voids and Number of Pads Suffering
Separation of Metallization Layer
(Total number of pads: 1000)

| Thickness T of | Thickness of each plating ($\mu$m) | | | | | | Pads suffering voids | Pads suffering |
|---|---|---|---|---|---|---|---|---|
| | 1st | 2nd | 3rd | 4th | 5th | 6th | | |
| *1.8 | 1.8 | | | | | | 139 | 0 |
| 2.7 | 1.4 | 1.3 | | | | | 68 | 0 |
| 3.5 | 1.8 | 1.7 | | | | | 22 | 0 |
| 6.0 | 1.9 | 2.0 | 2.1 | | | | 31 | 0 |
| 7.1 | 1.7 | 1.8 | 1.9 | 1.7 | | | 26 | 0 |
| *9.4 | 1.9 | 1.8 | 1.9 | 2.0 | 1.8 | | 36 | 13 |

*Comparative Example
As seen from Table 6, for a nickel plating thickness failing within the range of the present invention, the number of pads suffering voids is relatively small regardless of a plating count. By contrast, in the Comparative Example wherein the thickness of the nickel plating layer 5 is 1.8 $\mu$m, the number of pads suffering voids is still large. For a thickness (T) of the nickel plating layer 5 of not smaller than 9.4 $\mu$m, the problem of the separation of the base metallization layer 4 arise. These test results also prove the effectiveness of the present invention. Regarding a plating count, it is appropriate that plating be performed in three steps or less in view of work efficiency or productivity. For convenience of plating in a plurality of steps, the identical plating thickness is preferably employed for each step of plating. Also, the plating thickness for each step of plating is preferably not greater than 3.0 $\mu$m in order to prevent plating from blistering.
In the above-described embodiment, the Ni-B plating layer containing a high purity of nickel is formed through electroless plating. However, the present invention is not limited thereto. Ni alloy plating such as Ni-P plating may also provide an effect similar to that provided by Ni-B plating. When electrolytic nickel plating is employed, the similar effect is also obtained through use of a nickel plating thickness falling in the range of the present invention. Also, in the above-described embodiment, the nickel plating layer is plated with Au in order to prevent the nickel plating layer from oxidizing. During soldering, the Au plating easily dissolves and diffuses into solder so that the solder and the nickel plating layer contact directly each other.

wiring substrates include ball grid array (BGA), pin grid array (PGA), and land grid array (LGA) wiring substrates. In the above-described embodiment, the wiring substrate is formed from alumina ceramic. However, the present invention is not limited thereto. The wiring substrate may be formed from glass ceramic, AlN, mullite, or the like so long as the metallization layer of an electrode pad is formed from a high melting-point metal whose main components are tungsten, molybdenum, manganese, and like metal.

Obviously, numerous modifications and variations of the present invention are possible in light of the above teachings. It is therefore to be understood that within the scope of the appended claims, the present invention may be practiced otherwise than as specifically described herein.

What is claimed is:

1. A wiring substrate comprising;
   a ceramic member;
   a plurality of pads each comprised of a plurality of metal layers formed on said ceramic member in the form of a pad;
   wherein said pads are plated with a nickel layer on which a nickel-gold layer is formed, said nickel-gold layer having a nickel content of from 10 to 80 atomic percent;
   an electrical component connected to said nickel-gold layer through soldering.

2. A wiring substrate according to claim 1, wherein said nickel gol layer is form by plating a layer of nickel, plating a layer of gold on said nickel layer and thereafter diffusing gold into said nickel layer to form said nickel-gold layer.

3. A wiring substrate according to claim 1, wherein said electrical component comprises an IC chip.

4. A wiring substrate according to claim 3, wherein said IC chip comprises a flip chip.

5. A wiring substrate comprising:
   a ceramic member;
   a plurality of pads each comprised of a plurality of metal layers formed on said ceramic member in the form of a pad;
   wherein said pads are plated with a nickel layer on which a nickel-gold layer is formed, said nickel-gold layer consisting essentially of an alloy of nickel and gold and having a nickel content of from 10 to 80 atomic percent;
   an IC chip connected to said nickel-gold layer through soldering.

6. A wiring substrate according to claim 5, wherein said pad consists essentially of a plurality of plated layers, and having the outermost layer consisting essentially of a plated layer of Ni-B.

7. A method of manufacturing a wiring substrate comprised of a ceramic substrate, a plurality of electrode pads to which an electrical component is connected through soldering, said method comprising the steps of:
   printing a metallization paste in the form of electrode pads on a green ceramic sheet;
   simultaneously firing said metallization paste and said green ceramic sheet to form a ceramic substrate with electrode pads thereon; and
   forming a plurality of nickel layers on the fired electrode pads by plating said fired electrode pads a plurality of times.

8. A method of manufacturing a wiring substrate according to claim 7, wherein at least the outermost layer of the plurality of nickel layers is formed by plating Ni-B thereon.

9. A method of manufacturing a wiring substrate according to claim 7, wherein said process includes the step of heating said nickel layers at least one time during the step of forming a plurality of nickel layers by plating.

10. A method of manufacturing a wiring substrate according to claim 7, further comprising the step of forming a gold layer on the outermost of said nickel layers.

11. A method of manufacturing a wiring substrate according to claim 10, further comprising the step of heat treating said gold layer such that nickel diffuses into the gold layer.

12. A method of manufacturing a wiring substrate according to claim 10 wherein said electrical component comprises an IC chip.

13. A method of manufacturing a wiring substrate according to claim 12 wherein said IC chip comprises a flip chip.

14. A method of manufacturing a wiring substrate comprised of a ceramic substrate, a plurality of electrode pads to which at least one electrical component is connected through soldering, said method comprising the steps of:
   printing a metallization paste on a green ceramic sheet in the form of electrode pads;
   simultaneously firing said metallization paste and affix said green ceramic sheet to form a ceramic substrate with electrode pads thereon; and
   forming a plurality of nickel layers on the fired electrode pads by plating said fired electrode pads a plurality of times;
   forming gold layer on the outermost nickel layer; and
   heat treating said gold layer at a temperature in the range of 150–750° C. such that nickel diffuses into the gold layer to form a gold-nickel layer containing gold as the major component and nickel as an additional component.

* * * * *

UNITED STATES PATENT AND TRADEMARK OFFICE
CERTIFICATE OF CORRECTION

PATENT NO. : 6,225,569 B1
DATED : May 1, 2001
INVENTOR(S) : Hiroyuki Hashimoto; Kazuhisa Sato Page 1 of 1

It is certified that error appears in the above-identified patent and that said Letters Patent is hereby corrected as shown below:

Column 13, claim 1,
Line 5, "comprising;" should read -- comprising: --.

Claim 2,
Line 18, "nickel gol" should read -- nickel-gold --; and "is form" should read -- is formed --.

Column 14, claim 14,
Line 33, after "paste and", delete "affix".

Signed and Sealed this

Eleventh Day of December, 2001

Attest:

*Nicholas P. Godici*

NICHOLAS P. GODICI
*Attesting Officer*   *Acting Director of the United States Patent and Trademark Office*